(12) United States Patent
Hashimoto

(10) Patent No.: US 6,908,776 B2
(45) Date of Patent: Jun. 21, 2005

(54) SEMICONDUCTOR DEVICE AND METHOD OF MANUFACTURING THE SAME, APPARATUS FOR MANUFACTURING SEMICONDUCTOR DEVICE, CIRCUIT BOA AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 230 days.

(21) Appl. No.: 10/238,771

(22) Filed: Sep. 11, 2002

(65) Prior Publication Data
US 2003/0013229 A1 Jan. 16, 2003

Related U.S. Application Data

(63) Continuation of application No. 09/358,536, filed on Jul. 22, 1999, now Pat. No. 6,500,684.

(30) Foreign Application Priority Data

Jul. 31, 1998 (JP) ............................................ 10-230343
Jun. 2, 1999 (JP) ............................................ 11-154731

(51) Int. Cl.⁷ .......................... H01L 21/58; H01L 21/68
(52) U.S. Cl. ..................................... 438/16; 250/491.1
(58) Field of Search .......................... 438/16; 257/678; 250/491.1

(56) References Cited

U.S. PATENT DOCUMENTS 6,278,193 B1 * 8/2001 Coico et al. ................ 257/797
6,395,124 B1 * 5/2002 Oxman et al. ........... 156/275.5

FOREIGN PATENT DOCUMENTS

| JP | 55-166935 | 12/1980 |
| JP | 08-070013 | 3/1996 |
| JP | 10-123176 | 5/1998 |

OTHER PUBLICATIONS

Ken Gilleo, Polymer Thick Film, 1996, Van Norstrand Reinhold, A division of International Thomson Publishing, Inc., pp. 363–373.

* cited by examiner

*Primary Examiner*—Evan Pert
(74) *Attorney, Agent, or Firm*—Oliff & Berridge, PLC

(57) ABSTRACT

A method of manufacturing a semiconductor device comprising the steps of: preparing a flexible substrate which includes a base substrate having a light transmission property and an interconnecting pattern formed on one surface of the base substrate, the flexible substrate allowing a light to pass through a region other than the interconnecting pattern; recognizing a position of the interconnecting pattern by viewing the flexible substrate from a surface opposite to the surface on which the interconnecting pattern is formed through the base substrate; recognizing positions of electrodes formed on a semiconductor chip from a direction identical to that in recognizing the interconnecting pattern; and aligning the interconnecting pattern with the electrodes to connect the flexible substrate to the semiconductor chip by the face down bonding.

15 Claims, 5 Drawing Sheets

F I G. 4
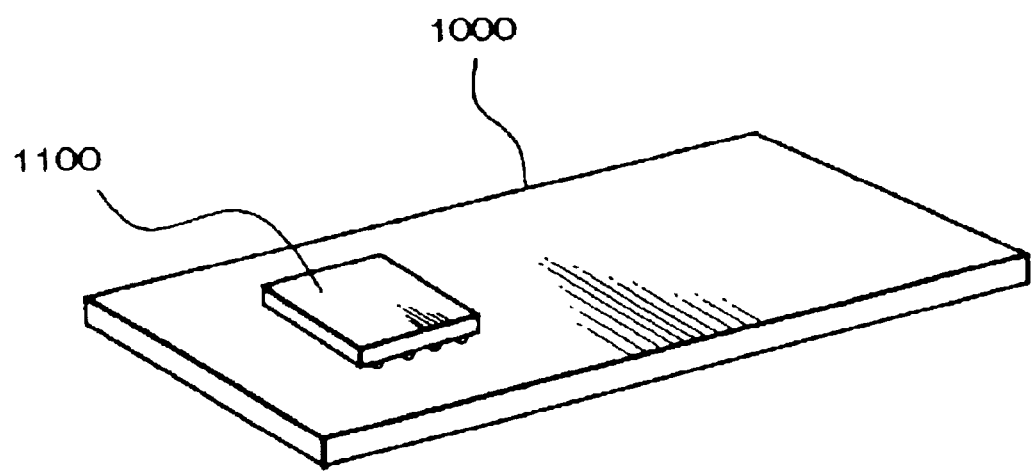

F I G. 5
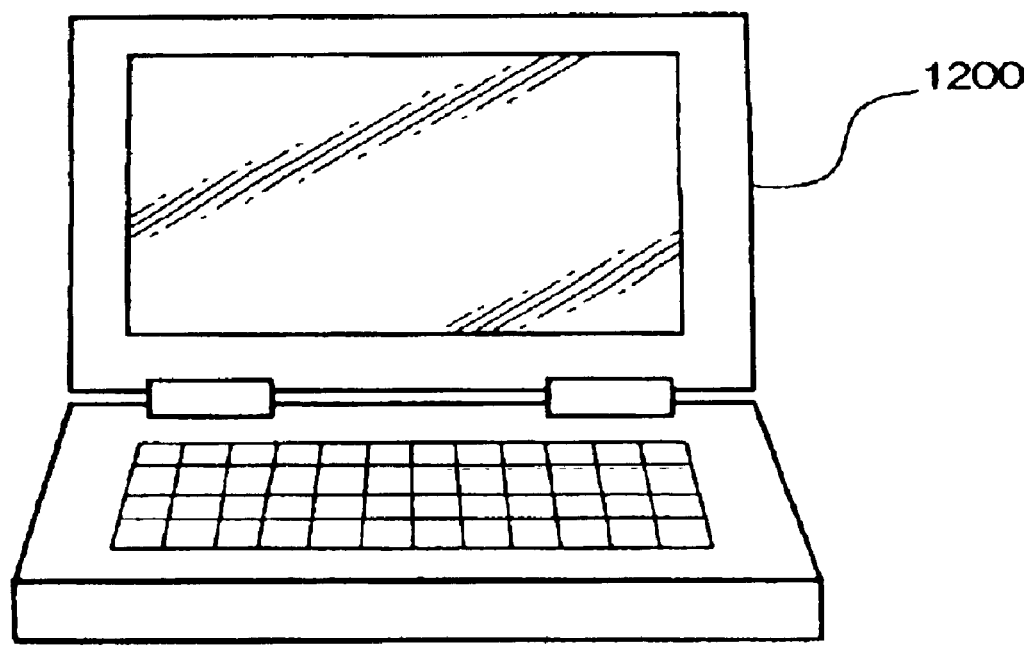

SEMICONDUCTOR DEVICE AND METHOD OF MANUFACTURING THE SAME, APPARATUS FOR MANUFACTURING SEMICONDUCTOR DEVICE, CIRCUIT BOA AND ELECTRONIC INSTRUMENT

BACKGROUND OF THE INVENTION

1. Field of Invention

The present invention relates to a semiconductor device and a method of manufacturing the same, an apparatus for manufacturing a semiconductor device, a circuit board and an electronic instrument.

2. Description of Related Art

As the electronic devices are recently manufactured to be more miniaturized, there is a demand for semiconductor device packages suitable for a high-density mounting. To answer these demands, surface-mounted packages such as Ball Grid Array (BGA) and Chip Scale/Size Package (CSP) have been developed. With this surface-mounted package, a semiconductor chip is mounted by the face-down bonding on a substrate on which an interconnecting pattern is formed.

In order to make a positional alignment of the interconnecting pattern with electrodes of the semiconductor chip, a conventional method of manufacturing the surface-mounted package uses an optical system. Specifically, the optical system is placed between a surface having electrodes of a semiconductor chip and a surface having an interconnecting pattern of a substrate, and images of both surfaces are taken by a camera, thus detecting the positions of the interconnecting pattern and electrodes. According to this method, because the optical system is complicated, errors in positioning are apt to occur, so that a degradation of mounting precision is brought about.

SUMMARY OF THE INVENTION

The present invention was made to solve the above problem, and an object of the present invention is to provide a method of manufacturing a semiconductor device which improves the mounting precision, the semiconductor device manufactured by the method, an apparatus for manufacturing the semiconductor device, a circuit board, and an electronic instrument.

(1) According to a first aspect of the present invention, there is provided a method of manufacturing a semiconductor device that comprises a flexible substrate including a base substrate that has a light transmission property and an interconnecting pattern formed on one surface of the base substrate, and a semiconductor chip that is connected to the flexible substrate and provided with electrodes, the method comprising the steps of:

detecting a position of at least one of the electrodes and interconnecting pattern by a detection means that is provided on a side opposite to a side on which the semiconductor chip is provided; and electrically connecting the interconnecting pattern to the electrodes.

(2) In this method of manufacturing a semiconductor device, positions of the interconnecting pattern and the electrodes may be detected by the detection means by viewing from a surface of the flexible substrate opposite to a surface on which the interconnecting pattern is formed.

Since the substrate having a light transmission property is used, the interconnecting pattern can be recognized from the reverse surface of the flexible substrate. When the surface on which the interconnecting pattern is formed and the surface on which the electrodes are formed are arranged parallel to each other, the recognition can be made without changing the direction of the detection means. Moreover, by moving the flexible substrate and the semiconductor chip in a direction parallel to these surfaces, the face down bonding can be performed after the recognition. As a result, it is possible to enhance a mounting precision without using a complicated optical system.

(3) In this method of manufacturing a semiconductor device, the flexible substrate may be a two-layered flexible substrate in which the interconnecting pattern is formed on the base substrate without using adhesive.

Generally-used adhesive inhibits light to transmit through the flexible substrate. By using the two-layered substrate that does not use such generally-used adhesive, the interconnecting pattern can be recognized through the surface opposite to that where the interconnecting pattern is formed.

(4) In this method of manufacturing a semiconductor device, the interconnecting pattern may be formed on the base substrate by sputtering.

As described above, by forming the interconnecting pattern on the substrate by sputtering, the interconnecting pattern can be easily recognized from the side opposite to that where the interconnecting pattern is formed.

(5) In this method of manufacturing a semiconductor device, the base substrate may be formed of polyethylene terephthalate.

Polyethylene terephthalate is an example of a material that has the light transmission property.

(6) In this method of manufacturing a semiconductor device, the detection means may comprise a camera; positions of the interconnecting pattern and the electrodes may be detected by the camera; and the camera may take an image of one of the flexible substrate having the interconnecting pattern and the semiconductor chip having the electrodes first, and then takes an image of the other.

(7) In this method of manufacturing a semiconductor device, the camera may move in a direction parallel to surfaces on which the interconnecting pattern and the electrodes are formed to take an image of one of the interconnecting pattern and the electrodes.

(8) According to a second aspect of the present invention, there is provided a semiconductor device manufactured by the above-described method.

(9) According to a third aspect of the present invention, there is provided a semiconductor device comprising a semiconductor chip and a flexible substrate that includes a base substrate and an interconnecting pattern formed on the base substrate, wherein the base substrate has a light transmission property; and wherein the interconnecting pattern on the base substrate is electrically connected to electrodes formed on the semiconductor chip.

(10) The semiconductor chip may be connected to the interconnecting pattern by the face down bonding.

(11) According to a fourth aspect of the present invention, there is provided an apparatus for manufacturing a semiconductor device, comprising:

a first transportation means for transporting a flexible substrate;

a second transportation means for transporting a semiconductor chip; and a detection means for position detecting, wherein the detection means is located on a side opposite to a side on which the semiconductor chip is provided to detect a position of an interconnecting pattern formed on the flexible substrate or a position of electrodes formed on the semiconductor chip.

(12) According to a fifth aspect of the present invention, there is provided a circuit board on which the above-described semiconductor device is mounted.

(13) According to a sixth aspect of the present invention, there is provided an electronic instrument comprising the above-described circuit board.

BRIEF DESCRIPTION OF THE DRAWINGS

FIG. 4 shows a circuit board on which the semiconductor device of the embodiment is mounted; and FIG. 5 shows an electronic instrument comprising a circuit board on which the semiconductor device of the embodiment is mounted.

DETAILED DESCRIPTION OF PREFERRED EMBODIMENTS

A preferred embodiment of the present invention will be described with reference to the accompanying drawings below.

Figure 1A:
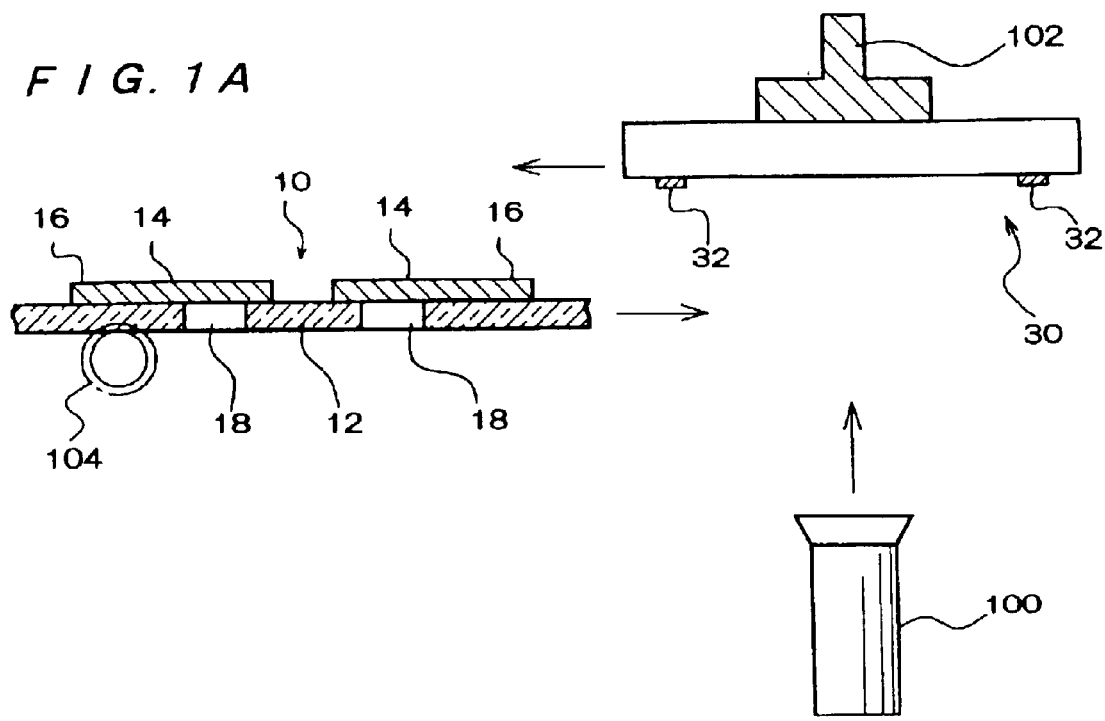
FIGS. 1A to 1C illustrate a method of manufacturing a semiconductor device according to the embodiment of the present invention.
Figure 1B:
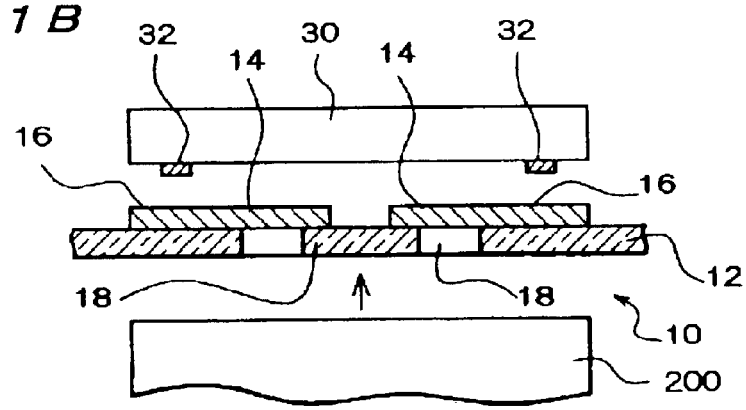
Figure 1C:
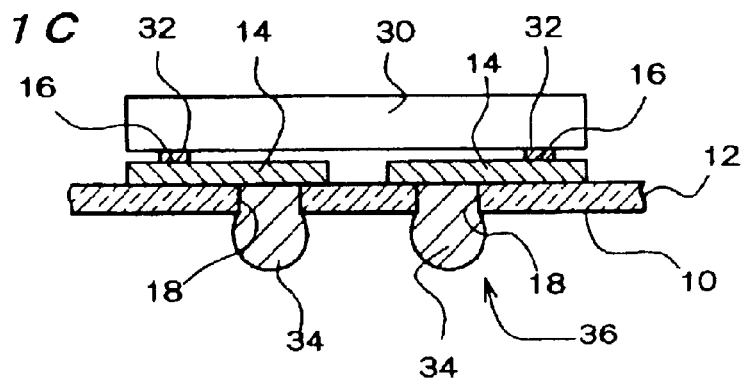

FIGS. 1A to 1C show a method of manufacturing a semiconductor device according to the embodiment of the present invention. In this embodiment, there is provided a flexible substrate 10 as shown in FIG. 1A. The flexible substrate 10 includes a base substrate 12 and an interconnecting pattern 14.

The base substrate 12 is made of, for example, an organic material or a resinous material, and has a flexibility. Furthermore, as long as the base substrate 12 has a light transmission property and allows visible light to pass therethrough, there is no limitation to transmittance of the base substrate 12. Also, as long as the basic circuit board 12 has a flexibility and light transmission property, there is no limitation to materials of the base substrate 12. Polyethylene terephthalate (PET) is, for example, taken as a material having a high light transmittance. Alternatively, polyimide resin may be employed. Since the base substrate 12 employing polyimide is colored, its thickness should preferably be 75 $\mu$m or less, more preferably 50 $\mu$m or less. A heat resistance engineering plastic film such as polyether sulfone (PES) or polyether ether ketone (PEEK) may also be employed as a material of the base substrate 12. Since these materials are transparent or light in color though they are colored, there is no problem in thickness in many cases.

The interconnecting pattern 14 is formed on one surface of the base substrate 12. Besides the interconnecting pattern 14 formed on one surface of the base substrate 12, another interconnecting pattern may be formed on the other surface thereof, but the interconnecting pattern on the other surface is not a constitutional feature of the present invention.

The interconnecting pattern 14 can be formed in a manner that a film made of an electrical conductive material such as copper is formed on the base substrate 12 by sputtering or the like and then the film is patterned by etching. In this case, the interconnecting pattern 14 is formed immediately on the base substrate 12, thus producing a two-layered substrate without intervention of adhesive. In general, the adhesive has a light screen property. Since the flexible substrate 10 does not include any adhesive having the light screen property, the interconnecting pattern 14 can be recognized visually from the reverse side through the base substrate 12. More specifically, the interconnecting pattern 14 can be visually recognized through the base substrate 12, from the reverse side opposite to the surface on which the interconnecting pattern 14 is formed. If polyimide resin is used in the base substrate 12, the base substrate 12 is colored. Therefore, in order to facilitate pattern recognition from the reverse side to the surface where the interconnecting pattern 14 is formed, the above-described two-layered substrate, especially the one formed by sputtering copper or the like on polyimide resin is more preferable. If the base substrate 12 is formed of PET having a high light transmittance, the interconnecting pattern 14 can be more easily recognized, so that it is also possible to select a three-layered substrate including adhesive.

Through holes 18 are formed in the base substrate 12, and the interconnecting pattern 14 is provided over the through holes 18. Specifically, the interconnecting pattern 14 is formed so as to cover the through holes 18. Therefore, the interconnecting pattern 14 can be electrically connected to a surface of the base substrate 12 opposite to the surface on which the interconnecting pattern 14 is formed by utilizing these through holes 18. Thus, external electrodes 34 (see FIG. 1C) electrically connected to the interconnecting pattern 14 can be formed on the surface of the base substrate 12 opposite to the surface on which the interconnecting pattern 14 is formed. It should be noted that the inner surfaces of the through holes 18 may be plated with an electrically conductive substance such as gold or copper.

There are lands 16 formed on the interconnecting pattern 14, thus facilitating the connection to the electrodes 32 of the semiconductor chip 30. It should be noted that bumps may be formed on the lands 16.

Figure 2:
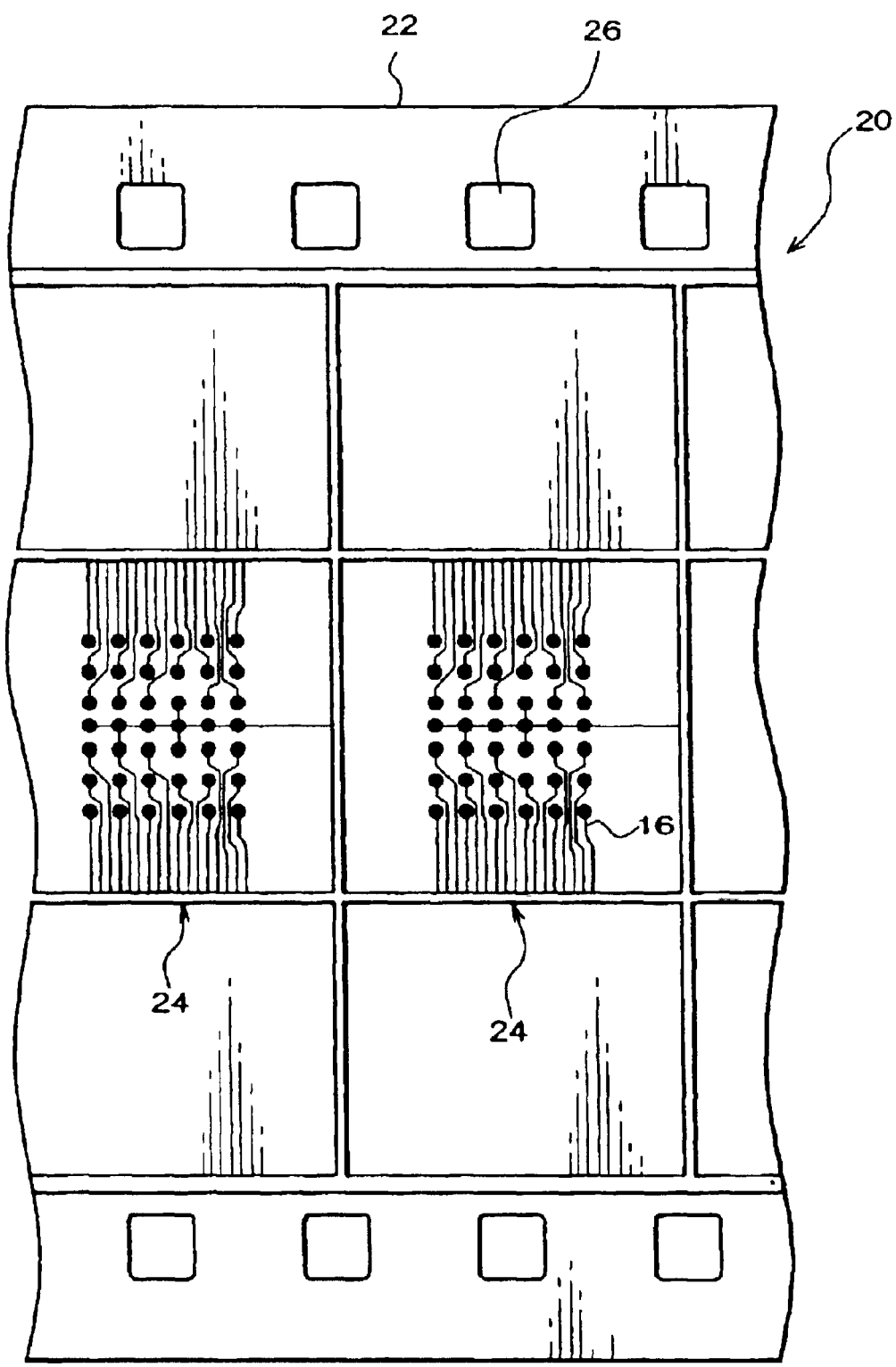
FIG. 2 shows a tape carrier as an example of a flexible substrate.

As described above, the flexible substrate 10 may be formed in a shape of a separated fragment, or a tape carrier 20 shown in FIG. 2 may be used to provide the flexible substrates. The tape carrier 20 comprises a substrate 22 in a tape form and interconnecting patterns 24 formed on at least one surface of the substrate 22. This tape carrier 20 is prepared in a state where it is wound on a reel (not shown). The substrate 22 has sprocket holes 26 formed continuously in the longitudinal direction on both ends in the width direction of the substrate 22. The sprocket holes 26 are formed so as to gear with sprockets 104 (see FIG. 1A) when the tape carrier 20 is wound off.

A manufacturing apparatus used in this embodiment comprises a first transportation means such as sprockets 104 which transport the flexible substrate 10, a second transportation means such as an attraction jig 102 which transports the semiconductor chip 30, and a detection means such as a camera 100 which performs a position detection.

In this embodiment, the flexible substrate 10 and the semiconductor chip 30 are arranged as shown in FIG. 1A. In FIG. 1A, the surface of the flexible substrate 10 on which the interconnecting pattern 14 is formed and the surface of the semiconductor chip 30 on which the electrodes 32 are formed are arranged parallel to each other, and they will face each other if the flexible substrate 10 and the semiconductor chip 30 move in a direction parallel to these surfaces to come close to each other. In other words, another surface of the flexible substrate 10 opposite to the surface on which the interconnecting pattern 14 is formed faces the same direction as the surface of the semiconductor chip 30 on which the electrodes 32 are formed, but the flexible substrate 10 and the semiconductor chip 30 do not overlap each other in this figure when they are viewed from a direction perpendicular to these surfaces.

Furthermore, the flexible substrate 10 and the semiconductor chip 30 are held by a sliding means (not shown) so as to be freely movable in a direction parallel to these surfaces.

In FIG. 1A, the camera 100 is located in a direction perpendicular to the surface of the flexible substrate 10 opposite to the surface on which the interconnecting pattern 14 is formed and also perpendicular to the surface of the semiconductor chip 30 on which the electrodes 32 are formed, and the camera 100 faces one of these surfaces. Note that the camera is fixed.

If the camera 100 is located on the side opposite to the surface of the flexible substrate 10 on which the interconnecting pattern 14 is formed, the camera can recognize the position of the interconnecting pattern 14 through the base substrate 12, because the base substrate 12 has a light transmission property as described.

The camera 100 takes an image of one of the interconnecting pattern 14 and the electrodes 32 that comes within the range of the camera 100. Thus, the position of the interconnecting pattern 14 or the electrodes 32 is recognized. When an image of the flexible substrate 10 is taken, a detection means (for example the camera 100) recognizes the positions of the lands 16 to which the electrodes 32 are connected. Specifically, basic information such as the shape of the interconnecting pattern 14 and the lands 16, or the positions of the lands 16 on the interconnecting pattern 14 has been previously stored in a memory means. Then, an image of the interconnecting pattern 14 is taken through the base substrate 12. The positions of the lands 16 are recognized based on the basic information and image information relating to the interconnecting pattern 14 obtained by the camera 100. If a strict precision is needed, the position of the lands may be recognized by taking images of positioning marks previously provided independently of the lands in the same step where the interconnecting pattern is formed through the base substrate 12 and by calculating the positions of the lands on the basis of the information about the positioning marks. This recognition is performed by a computation means, and data relating to the recognized positions may be stored in a memory means.

After the flexible substrate 10 or the semiconductor chip 30 is taken by the camera 100 and its position is recognized, the one is moved away in a direction parallel to the surface thereof to be out of the range of the camera 100, and the other one of the flexible substrate 10 and the semiconductor chip 30 that has not been taken yet moves to come within the range of the camera 100. Subsequently, the interconnecting pattern 14 or the electrodes 32 are similarly recognized by the camera 100. If data of direction and distance relating to the movement of the flexible substrate 10 and the semiconductor chip 30 is stored, the positional data of the interconnecting pattern 14 and the electrodes 32 can be utilized thereafter.

The position of the lands 16 for connection to the electrodes 32 and the position of the electrodes 32 are thus recognized, then they are aligned (see FIG. 1B). The alignment of the lands 16 and the electrodes 32 can be checked by viewing through the base substrate 12. It is an important feature of the present invention that the alignment can be made sure by viewing the image thereof before the next connecting step.

According to the above-described processes, the alignment of the electrodes 32 with the lands 16 that are connected to the electrodes 32 can be simply performed by the fixed camera 100 without a complicated optical system.

Next, the face down bonding for the lands 16 and the electrodes 32 is performed as shown in FIG. 1B. In this embodiment, a general-purpose bonder for the gang bonding style is used, and the bonding tool 200 presses the flexible substrate 10 from the side opposite to the surface on which the interconnecting pattern 14 is formed toward the semiconductor chip 30.

It should be noted that when the tape carrier 20 is used as the flexible substrate 10 as shown in FIG. 2, the alignment is performed for the semiconductor devices as a plurality of units and then the process shown in FIG. 1B may be conducted subsequently.

After the lands 16 and the electrodes 32 are connected together, the solder taking the ball shape is provided on the interconnecting pattern 14 so as to form the external electrodes 34. Then, the flexible substrate 10 is punched along the external shape of the semiconductor chip 30, or alternatively punched to an arbitrary shape, thus obtaining the semiconductor device 36.

As described above, according to the embodiment, the lands 16 and the electrodes 32 that face each other can be easily connected by using the general-purpose bonder.

Although the description was made for the example of the automatic position recognition and alignment apparatus (or steps), the present invention can be applied also to a manual alignment apparatus, in which an operator looks a camera image on a screen for alignment, and this brings about a great merit to the present invention. Thus, a bonding with a high precision can be performed using a simple apparatus without an expensive equipment.

Figure 3:
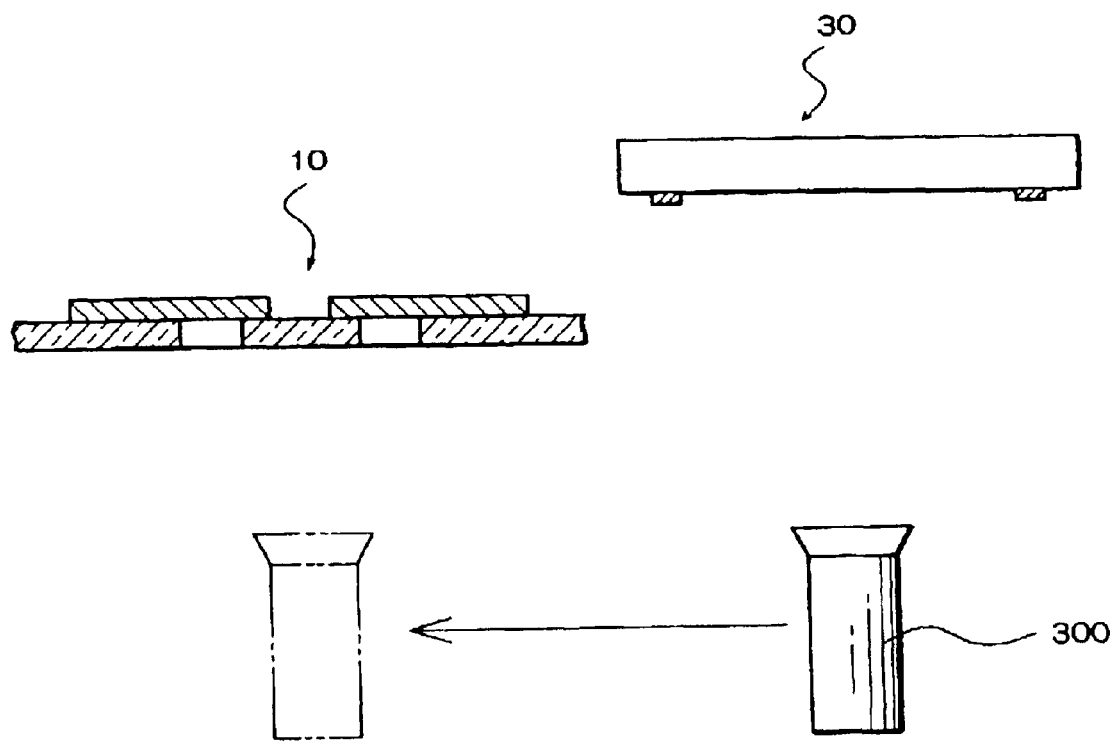
FIG. 3 shows a modification of the embodiment in accordance with the present invention.

It should be noted that the present invention is not limited to the above-described embodiment and various modifications can be made therein without departing from spirit and scope of the invention. For example, instead of the processes shown in FIG. 1A, the process shown in FIG. 3 may be performed. Specifically, in FIG. 1A, the position of the camera 100 is stationary, and the flexible substrate 10 and the semiconductor chip 30 move in parallel with each other. In FIG. 3, the camera 200 moves in parallel with the flexible substrate 10 and the semiconductor chip 30, and the positions of them are stationary. The similar effect to that of the above-described embodiment can be achieved also by such structure. The positions of the flexible substrate 10 and the semiconductor chip 30 are stationary when the camera 200 takes the images of them in FIG. 3, but it is preferable that they move in parallel with each other at the time of the face down bonding for alignment as shown in FIG. 1B.

In the above-described embodiment, the description was made for the manufacture of the Chip Size/Scale Package (CSP) structure, but the method according to the present invention is not limited to that, and the present invention can be applicable to the mounting of whole Face Down (FD) structures using a substrate having a light transmission property such as the Chip On Flex (COP) structure. Also in this case, the connection process for the semiconductor chip and the substrate is important.

In FIG. 4, illustrated is the circuit board 1000 on which the semiconductor device 1100 manufactured by the method according to the above described embodiment is mounted. An organic substrate such as a glass epoxy resin substrate is generally used for the circuit board 1000. An interconnecting pattern formed of, for example, copper is formed on the circuit board 1000 to provide a desired circuit. The interconnecting pattern and the external electrodes of the semiconductor device 1100 are mechanically connected, thus achieving an electrical conductivity between them.

It should be noted that the mounting area in the semiconductor device 1100 can be reduced to the mounting area for bare chip mounting. For this reason, when this circuit board 1000 is used in an electronic instrument, the electronic instrument itself can be made more compact. Within the same area, a larger mounting area is available, and higher functionality can also be achieved.

As an electronic instrument provided with this circuit board 1000, FIG. 5 shows a notebook personal computer 1200.

Although the present invention is applied to a semiconductor device in the above-described embodiment, the present invention can be applied to various surface-mounted electronic components that require a plurality of external terminals similar to a semiconductor device, whether active or passive. Electronic components include, for example, resistors, capacitors, coils, oscillators, filters, temperature sensors, thermistors, varistors, variable resistors, and fuses.

What is claimed is:

1. A method of manufacturing a semiconductor device comprising the steps of:
   (a) positioning a detector, a semiconductor chip having an electrode, and a substrate having an interconnecting pattern formed thereon such that the detector is positioned so as to be opposed to the electrode and positioned on a side opposite to the interconnecting pattern, the substrate having a light transmission property;
   (b) detecting a position of one of the electrode and the interconnecting pattern by the detector;
   (c) detecting a position of the other of the electrode and the interconnecting pattern by the detector;
   (d) overlapping the electrode and the interconnecting pattern; and
   (e) checking that the electrode and the interconnecting pattern overlap.

2. A method of manufacturing a semiconductor device comprising the steps of:
   (a) positioning a detector, a semiconductor chip having an electrode, and a substrate having an interconnecting pattern and a positioning mark formed thereon such that the detector is positioned so as to be opposed to the electrode and positioned on a side opposite to the interconnecting pattern, the substrate having a light transmission property;
   (b) detecting a position of one of the electrode and the positioning mark by the detector;
   (c) detecting a position of the other of the electrode and the positioning mark by the detector;
   (d) calculating a position of an electrically connecting portion in the interconnecting pattern to be electrically connected to the electrode, on a basis of the detected position of the positioning mark; and
   (e) overlapping the electrode and the electrically connecting portion in the interconnecting pattern.

3. The method of manufacturing a semiconductor device as defined in claim 2, further comprising checking that the electrode and the electrically connecting portion in the interconnecting pattern overlap.

4. The method of manufacturing a semiconductor device as defined in claim 1, wherein each of the substrate and the semiconductor chip is movable in a direction parallel to a surface on which is formed the interconnecting pattern or the electrode to take an image of the interconnecting pattern or the electrode.

5. The method of manufacturing a semiconductor device as defined in claim 2, wherein each of the substrate and the semiconductor chip is movable in a direction parallel to a surface on which is formed the interconnecting pattern or the electrode to take an image of the interconnecting pattern or the electrode.

6. A method of manufacturing a semiconductor device comprising the steps of:
   (a) positioning a detector, a semiconductor chip having an electrode, and a substrate having an interconnecting pattern formed thereon such that the detector is positioned so as to be opposed to the electrode and positioned on a side opposite to the interconnecting pattern, the substrate having a light transmission property;
   (b) detecting a position of one of the electrode and the interconnecting pattern by the detector;
   (c) detecting a position of the other of the electrode and the interconnecting pattern by the detector; and
   (d) overlapping the electrode and the interconnecting pattern,
   wherein each of the steps (b) and (c) includes transferring the substrate or the semiconductor chip in a direction parallel to a surface on which the interconnecting pattern or the electrode is formed to take an image of the interconnecting pattern or the electrode.

7. The method of manufacturing a semiconductor device as defined in claim 1, wherein the substrate is formed of polyethylene terephthalate.

8. The method of manufacturing a semiconductor device as defined in claim 2, wherein the substrate is formed of polyethylene terephthalate.

9. The method of manufacturing a semiconductor device as defined in claim 1, wherein the substrate is formed of polyimide resin having its thickness of 75 $\mu$m or less.

10. The method of manufacturing a semiconductor device as defined in claim 2, wherein the substrate is formed of polyimide resin having its thickness of 75 $\mu$m or less.

11. The method of manufacturing a semiconductor device as defined in claim 1, wherein the detector includes a camera.

12. The method of manufacturing a semiconductor device as defined in claim 2, wherein the detector includes a camera.

13. The method of manufacturing a semiconductor device as defined in claim 11, wherein the camera moves in a direction parallel to a surface on which the interconnecting pattern or the electrode is formed to take an image of the interconnecting pattern or the electrode.

14. The method of manufacturing a semiconductor device as defined in claim 12, wherein the camera moves in a direction parallel to a surface on which the interconnecting pattern or the electrode is formed to take an image of the interconnecting pattern or the electrode.

15. An apparatus for manufacturing a semiconductor device comprising:
   a first carrier, the first carrier including sprockets to wind up or pay out a flexible substrate on or from a reel, the flexible substrate including a base substrate having a light transmission property and an interconnecting pattern on the base substrate;

a second carrier, the second carrier carrying a semiconductor chip having an electrode; and a detector, the detector positioned so as to be opposed to the electrode and positioned on a side opposite to the interconnecting pattern, the detector detecting positions of the electrode and the interconnecting pattern.

* * * * *